(12) United States Patent
Shih et al.

(10) Patent No.: US 8,994,178 B2
(45) Date of Patent: Mar. 31, 2015

(54) INTERCONNECT STRUCTURE AND METHOD FOR FORMING THE SAME

(75) Inventors: Po-Cheng Shih, Hsinchu (TW); Hui-Chun Yang, Hsinchu (TW); Chih-Hung Sun, Hsinchu (TW); Joung-Wei Liou, Zhudong Town (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/475,581

(22) Filed: May 18, 2012

(65) Prior Publication Data
US 2013/0256888 A1 Oct. 3, 2013

Related U.S. Application Data

(60) Provisional application No. 61/617,513, filed on Mar. 29, 2012.

(51) Int. Cl.
| | | |
|---|---|---|
| H01L 23/48 | (2006.01) | |
| H01L 23/52 | (2006.01) | |
| H01L 29/40 | (2006.01) | |
| H01L 21/768 | (2006.01) | |
| H01L 23/485 | (2006.01) | |
| H01L 23/522 | (2006.01) | |
| H01L 23/532 | (2006.01) | |

(52) U.S. Cl.
CPC ........ *H01L 23/485* (2013.01); *H01L 21/76807* (2013.01); *H01L 21/76826* (2013.01); *H01L 21/76829* (2013.01); *H01L 21/76849* (2013.01); *H01L 21/76883* (2013.01); *H01L 23/5226* (2013.01); *H01L 23/53223* (2013.01); *H01L 23/53238* (2013.01); *H01L 23/53295* (2013.01); *H01L 2924/00* (2013.01); *H01L 2924/0002* (2013.01)

USPC .......................................... 257/758; 257/762

(58) Field of Classification Search
USPC .................................................. 257/758, 762
See application file for complete search history.

(56) References Cited

U.S. PATENT DOCUMENTS

| | | | | |
|---|---|---|---|---|
| 6,323,511 | B1 * | 11/2001 | Marsh | ............................ 257/295 |
| 6,340,435 | B1 * | 1/2002 | Bjorkman et al. | ............... 216/72 |
| 6,534,870 | B1 * | 3/2003 | Shibata et al. | ................. 257/759 |
| 6,603,204 | B2 | 8/2003 | Gates et al. | |
| 6,677,680 | B2 | 1/2004 | Gates et al. | |
| 2003/0089992 | A1 | 5/2003 | Rathi et al. | |
| 2011/0115091 | A1 * | 5/2011 | Watanabe | ...................... 257/758 |

FOREIGN PATENT DOCUMENTS

| | | |
|---|---|---|
| KR | 2003-0079994 | 10/2003 |
| KR | 10-2004-0031695 | 4/2004 |
| KR | 10-0650226 | 11/2006 |

OTHER PUBLICATIONS

Notice of Allowance dated Feb. 5, 2014 and English translation from corresponding application No. KR 10-2012-0107064.

* cited by examiner

*Primary Examiner* — Phat X Cao
(74) *Attorney, Agent, or Firm* — Lowe Hauptman & Ham, LLP

(57) ABSTRACT

A interconnect structure includes a first etch stop layer over a substrate, a dielectric layer over the first etch stop layer, a conductor in the dielectric layer, and a second etch stop layer over the dielectric layer. The dielectric layer contains carbon and has a top portion and a bottom portion. A difference of C content in the top portion and the bottom portion is less than 2 at %. An oxygen content in a surface of the conductor is less than about 1 at %.

20 Claims, 9 Drawing Sheets

INTERCONNECT STRUCTURE AND METHOD FOR FORMING THE SAME

CROSS-REFERENCE TO RELATED APPLICATIONS

The present application claims priority of U.S. Provisional Patent Application Ser. No. 61/617,513, filed on Mar. 29, 2012, which is incorporated herein by reference in its entirety.

TECHNICAL FIELD

The present invention relates to semiconductor devices, and particularly to copper interconnects and method for fabrication.

BACKGROUND

Semiconductor devices are used in a variety of electronic applications, such as personal computers, cell phones, digital cameras, and other electronic equipment, as examples. As technology has progressed, the demand for smaller semiconductor devices with improved performance has increased. As feature densities increase, widths of conductive lines and spacing between the conductive lines of back-end of line (BEOL) interconnect structures also need to be scaled smaller.

A move is being made away from traditional materials used in the past in semiconductor device designs, in order to meet these demands. To reduce an RC time delay, low dielectric constant (low-k) materials are being used as insulating materials, and there is a switch being made to the use of copper for interconnect materials, rather than aluminum. Advantages of using copper for semiconductor device interconnects include abilities to operate faster and manufacture thinner conductive lines because copper has lower resistivity and increased electromigration resistance compared to aluminum. Combining copper interconnects with low-k dielectric materials increases interconnect speed by reducing the RC time delay.

Copper interconnects are often formed using damascene processes rather than by direct etching. Damascene processes are typically either single or dual damascene, which includes forming openings by patterning and etching inter-metal dielectric (IMD) layers and filling the openings with copper. However, there are some challenges in the copper damascene structure, such as adhesion issues between the low-k dielectric material and the underlying layer. The adhesion issues may cause film cracking and/or peeling, therefore, result device package qualification failure.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
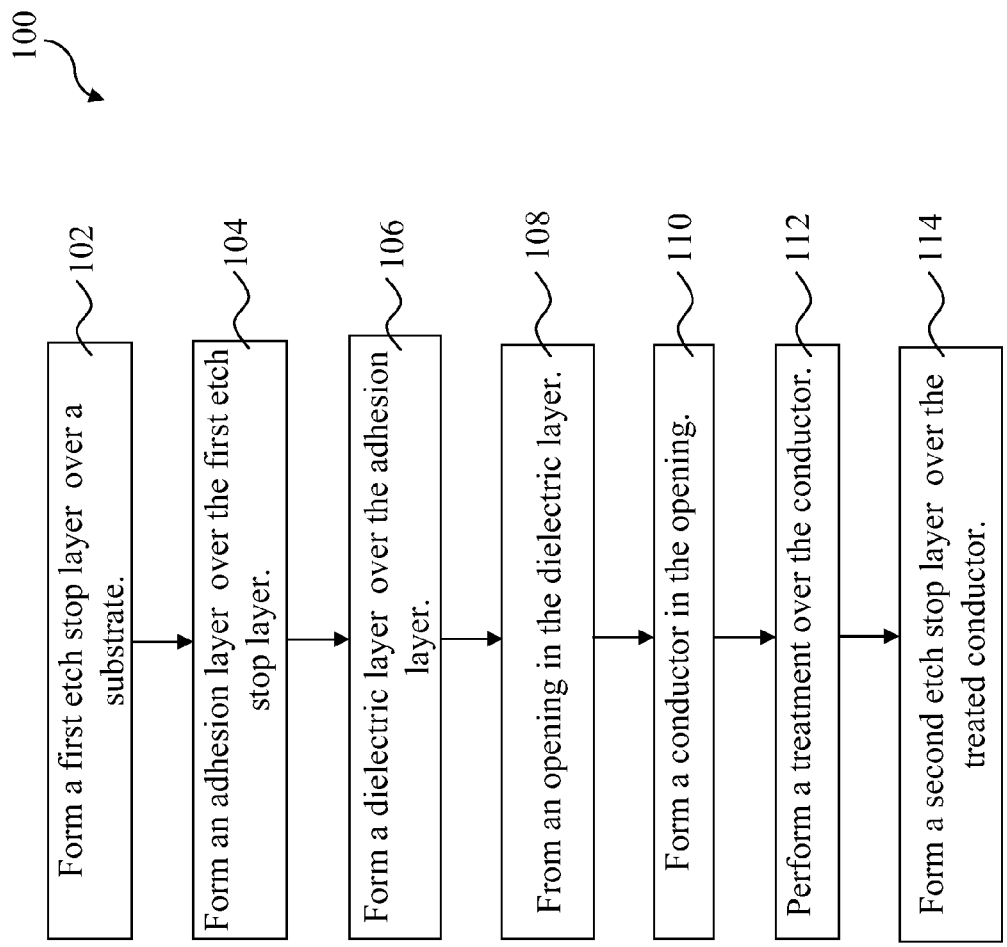
FIG. 1 is a flow chart of a method for fabricating an integrated circuit device according to at least one embodiment of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-9, a method 100 and a semiconductor device 200 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOS s), high voltage transistors, and/or high frequency transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
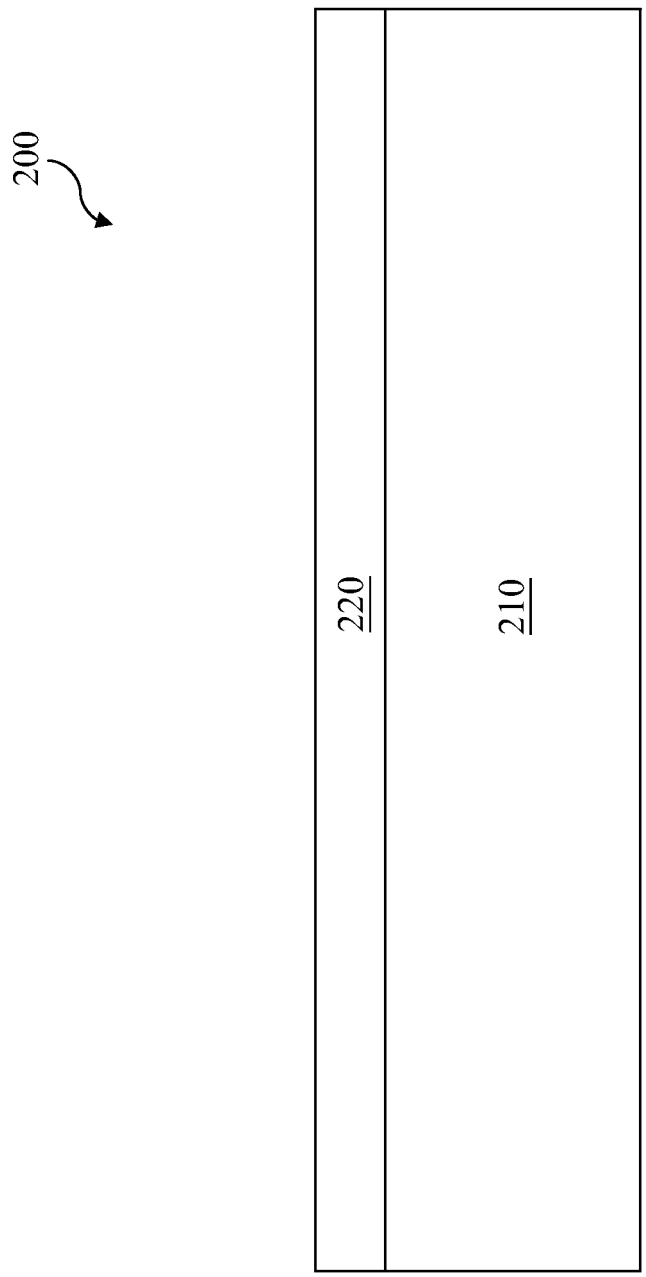
FIGS. 2-7 and 9 are various diagrammatic cross-sectional views of at least one embodiment of an integrated circuit device during various fabrication stages according to the method of FIG. 1.

Referring to FIGS. 1 and 2, the method 100 begins at step 102, wherein a first etch stop layer (ESL) 220 is formed over a substrate 210. In the present embodiment, the substrate 210 is a semiconductor substrate comprising silicon. Alternatively, the substrate 210 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some embodiments, the semiconductor substrate may include a doped epi layer. In other embodiments, the silicon substrate may include a multilayer compound semiconductor structure.

The substrate 210 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 210, in a P-well structure, in an N-well structure, in a dual-well structure, or using a raised structure. The semiconductor device 200 may include a PFET device and/or an NFET device, and thus, the substrate 210 may include various doped regions configured for the PFET device and/or the NFET device.

The first etch stop layer 220 for controlling an end point during subsequent etching processes is deposited on the above-described substrate 210. In some embodiments, the first etch stop layer 220 comprises elements of C, Si, N and H. In some embodiments, the first etch stop layer 220 is formed of silicon oxide, silicon nitride, silicon carbide, silicon oxynitride or combinations thereof. In some embodiments, the first etch stop layer 220 has a thickness of about 10 angstroms to about 1000 angstroms. In some embodiments, the first etch stop layer 220 is formed through any of a variety of deposition techniques, including low-pressure chemical vapor deposition (LPCVD), atmospheric-pressure chemical vapor deposition (APCVD), plasma-enhanced chemical vapor deposition (PECVD), physical vapor deposition (PVD), sputtering and other suitable deposition techniques. Alternatively, the first etch stop layer 220 is formed by a thermal process. In some embodiments, the first etch stop layer 220 has a thickness ranging between about 100 Angstroms and about 300 Angstroms.

Figure 3:
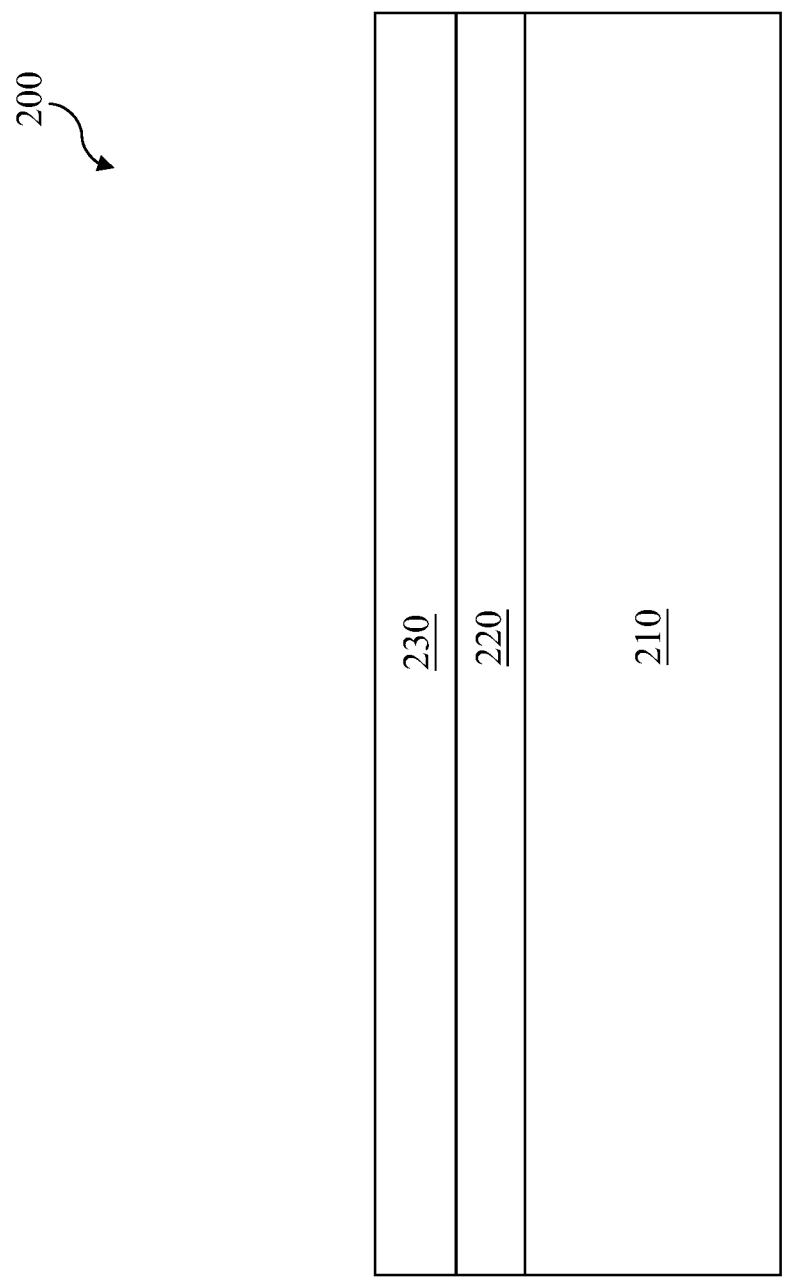

Referring to FIGS. 1 and 3, the method 100 continues with step 104 in which an adhesion layer 230 is formed over the first etch stop layer 220. In some embodiments, the adhesion layer 230 includes SiOx-containing material, SiCN-containing material, SiON-containing material, or combinations thereof. In some embodiments, the adhesion layer 230 is formed using LPCVD, APCVD, PECVD, PVD, or sputtering. Alternatively, the adhesion layer 230 is formed using a thermal process. In the present embodiment, the adhesion layer 230 is tetraethoxysilane (TEOS). In some embodiments, the adhesion layer 230 has a thickness ranging between about 100 Angstroms and about 300 Angstroms.

Figure 4:
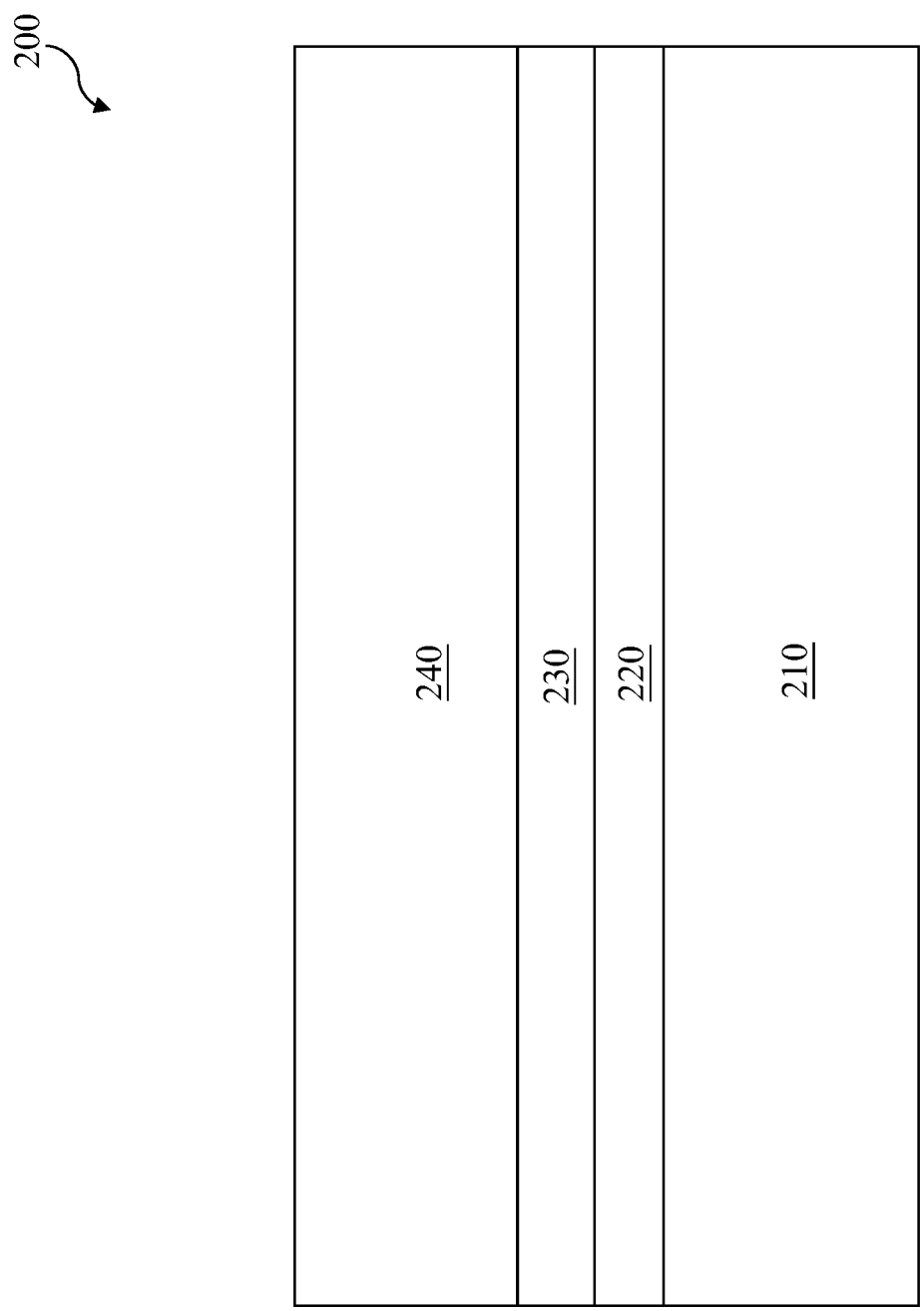

Referring to FIGS. 1 and 4, the method 100 continues with step 106 in which a dielectric layer 240 is formed over the adhesion layer 230. The dielectric layer 240 may be a single layer or a multi-layered structure. In some embodiments, the dielectric layer 240 is formed using a CVD process, such as PECVD, LPCVD, or atomic-layer deposition (ALD). In some embodiments, the dielectric layer 240 comprises elements of Si, C, O, and H. In some embodiments, the dielectric layer 240 is a C-containing layer with C content greater than 10 at %. In alternative embodiments, the dielectric layer 240 is a C-containing layer with C content ranging between about 10 at % and about 13 at %. In some embodiments, the dielectric layer 240 has a thickness ranging between about 300 Angstroms and about 2500 Angstroms.

In some embodiments, the dielectric layer 240 is formed by PECVD. In some embodiments, the dielectric layer 240 use at least one precursor, such as tetramethylcyclotetrasiloxane (TMCTS), octamethylcyclotetrasiloxane (OMCTS), diethoxymethylsilane (DEMS), diethoxyldimethylsilane (DEDMS) or other related cyclic and non-cyclic silanes and siloxanes. In some embodiments, the precursor may be used in conjunction with an inert gas such as He or Ar and/or a reactant gas such as $H_2O$, $O_2$, or $CO_2$. In some embodiments, the dielectric layer 240 is formed using a C-containing gas, an O-containing gas, and a H-containing gas with flow rates ranging between about 1700 sccm (standard cubic center per minute) and about 3000 sccm, about 700 sccm and about 1200 sccm, and about 20 sccm and about 300 sccm, respectively. In some embodiments, the dielectric layer 240 is formed using an RF power ranging between about 600 watts and about 1100 watts. In some embodiments, the dielectric layer 240 is formed at a temperature ranging between about 200° C. and about 320° C.

In some embodiments, the dielectric layer 240 is a low dielectric constant (low-k) layer having a dielectric constant of less than 3.0 and functions as an inter-metal dielectric (IMD) layer. In some embodiments, the dielectric layer 240 is a low-k layer having a dielectric constant ranging between about 2.5 and about 2.8. A wide variety of low-k materials may be employed in accordance with embodiments, for example, spin-on inorganic dielectrics, spin-on organic dielectrics, porous dielectric materials, organic polymer, organic silica glass, fused silica glass (FSG) (SiOF series material), hydrogen silsesquioxane (HSQ) series material, methyl silsesquioxane (MSQ) series material, or porous organic series material.

Figure 5:
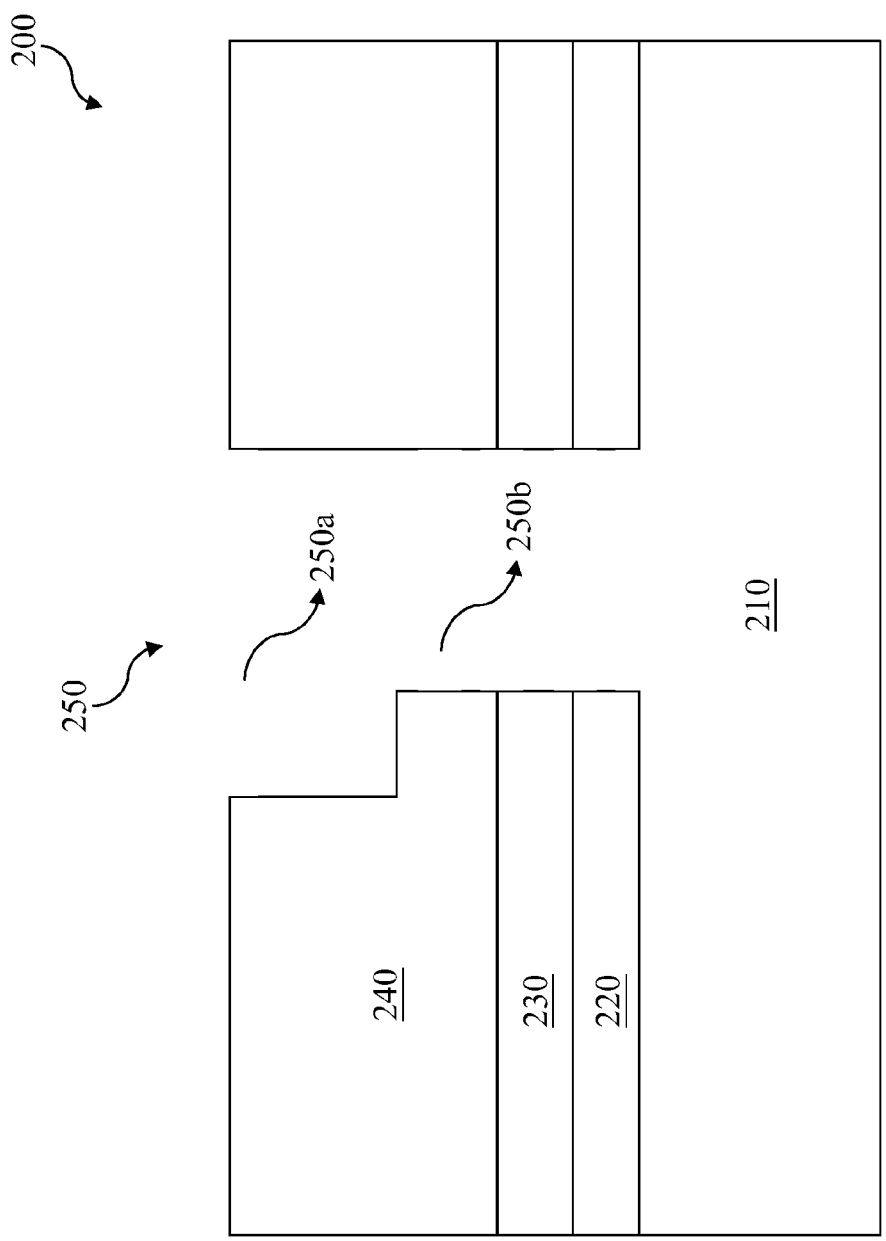

Referring to FIGS. 1 and 5, the method 100 continues with step 108 in which an opening 250 is formed in the dielectric layer 240. In some embodiments, the opening 250 is formed through the dielectric layer 240, the adhesion layer 230, and the first etch stop layer 220. In some embodiments, the opening 250 is a dual damascene opening including an upper trench section 250a and a lower via-hole section 250b to define a contact region. Although FIG. 5 illustrates a dual damascene opening in the dielectric layer 240, the use of single damascene openings in the IMD layer is possible in some embodiments. In dual damascene techniques including a "via-first" patterning method or a "trench-first" patterning method, the upper trench section 250a and the lower via-hole section 250b may be formed using a typical lithographic process with masking technologies and anisotropic etch operations (e.g., plasma etching or reactive ion etching). A bottom etch stop layer, a middle etch stop layer, a polish stop layer, or an anti-reflective coating (ARC) layer may be optionally deposited on or intermediately within the dielectric layer 240, providing a clear indicator of an end point for a particular etching process.

Figure 6:
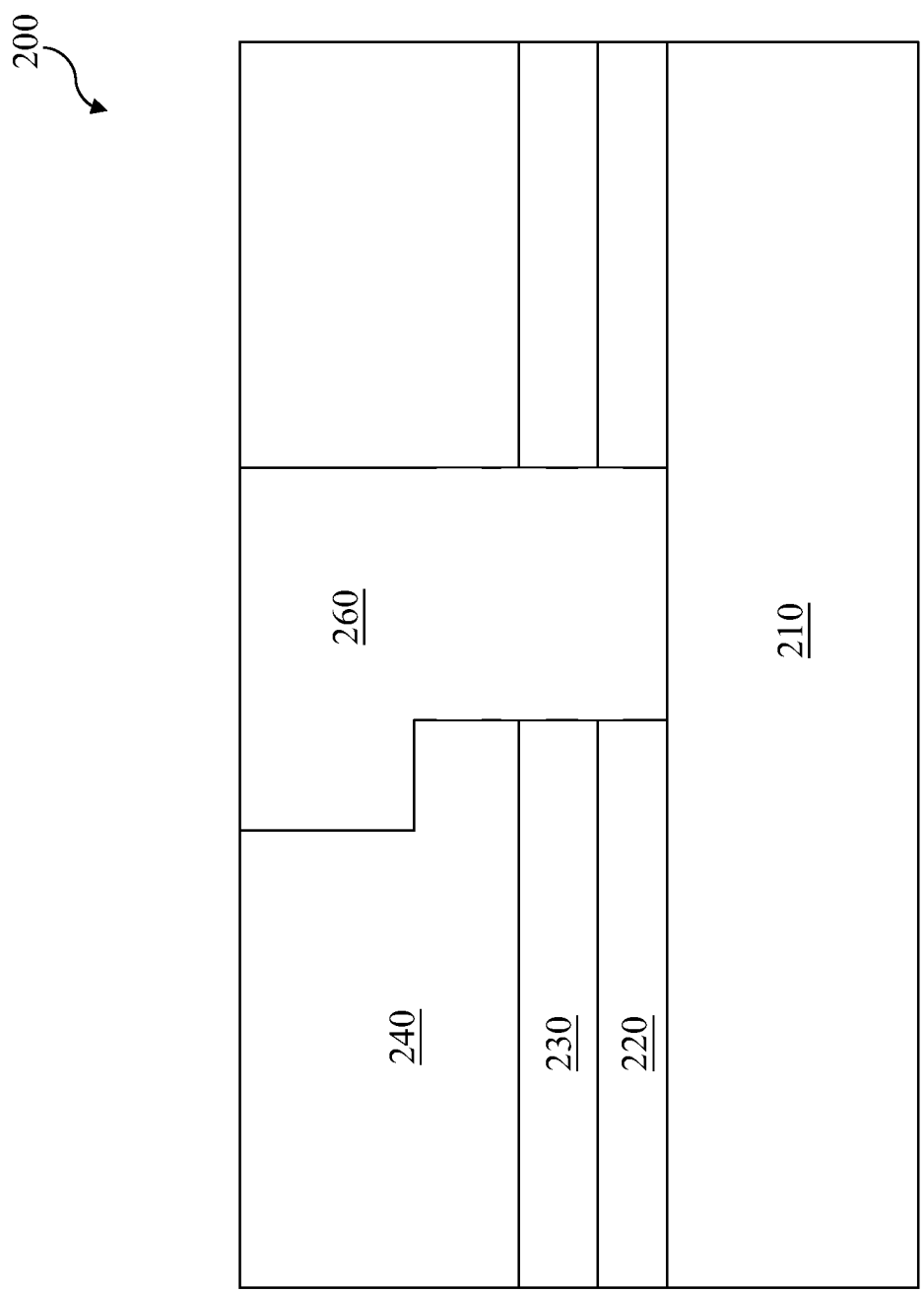

Referring to FIGS. 1 and 6, the method 100 continues with step 110 in which a conductor 260 is formed in the opening 250. In some embodiments, the conductor 260 is formed by a deposition process, e.g., electro-chemical plating (ECP). In some embodiments, the conductor 260 contains at least one main metal element, e.g., copper (Cu). In alternative embodiments, the conductor 260 further contains an additive metal element different from the main metal element, such as aluminum.

Still referring to FIG. 6, a barrier layer (not shown) may be deposited to line the sidewalls the openings 250 before forming the conductor 260. In some embodiment, the barrier layer includes Ti, TiN, Ta, TaN, other proper material, or combinations thereof. A conductive seed layer (not shown) may be further formed over the barrier layer before forming the conductor 260. In one embodiment, the conductive seed layer is a metal alloy layer containing at least a main metal element, e.g., copper (Cu). In at least one embodiment, the conductive seed layer is formed by using PVD, CVD, PECVD, LPCVD, or other deposition techniques. A chemical mechanical polishing (CMP) process may be performed after the formation of the conductor 260 to remove excess portions of the conductor 260 over the dielectric layer 240, thus exposing the top surface of the dielectric layer 240 and achieving a planarized surface.

Figure 7:
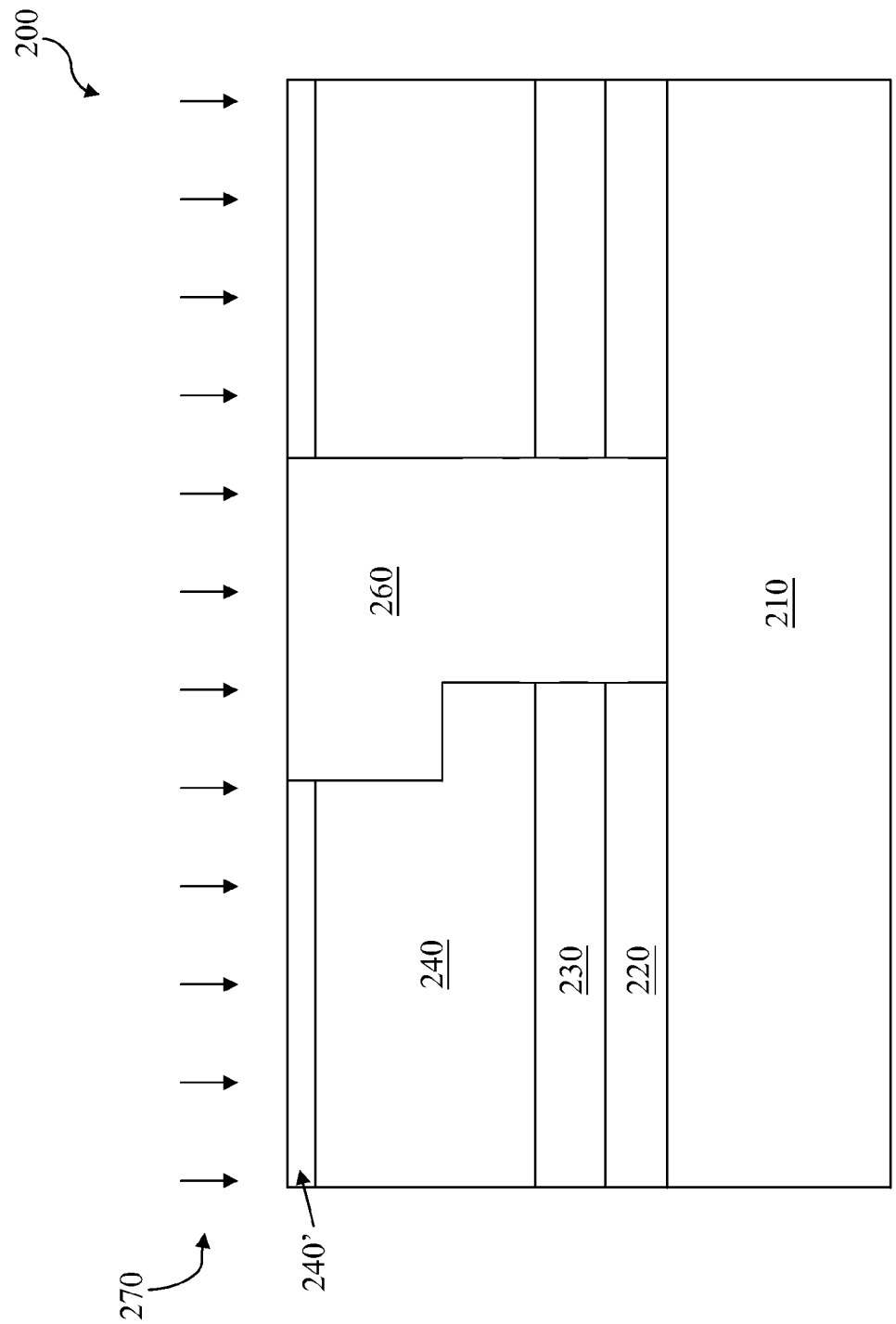

Referring to FIGS. 1 and 7, the method 100 continues with step 112 in which a treatment 270 is performed over the conductor 260. In some embodiments, the treatment 270 reduces native oxide (e.g., CuOx) in a surface of the conductor 260 such that the element of oxygen in the surface of the conductor 260 is less than about 1 at %. In some embodiments, the treatment 270 is performed by remote plasma using NH$_3$ gas. In alternative embodiments, the treatment 270 is performed by remote plasma using NH$_3$ and N$_2$ gases, wherein a ratio of flow rates of N$_2$ to NH$_3$ is less than 1. In some embodiments, the treatment 270 is performed using NH$_3$ with a gas flow rate ranging between about 700 sccm and about 1000 sccm. In some embodiments, the treatment 270 is performed using an RF power ranging between about 700 watts and about 3000 watts. In some embodiments, the treatment 270 is performed at a temperature ranging between about 200° C. and about 400° C.

Figure 8:
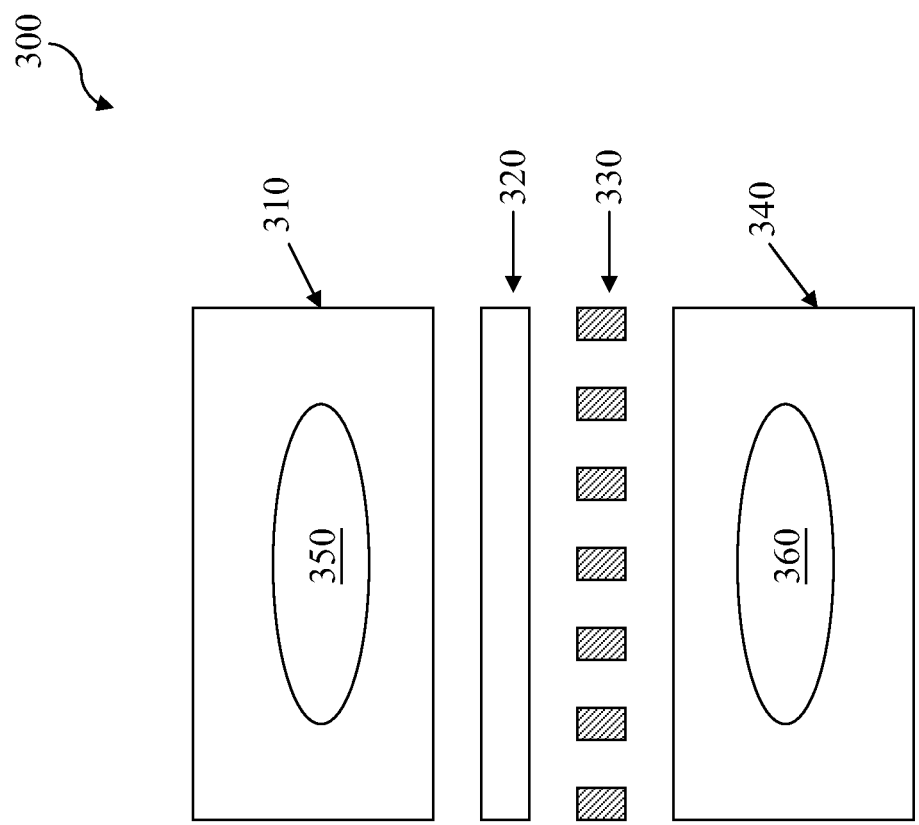
FIG. 8 is a diagram of a reactor.

FIG. 8 is an exemplary schematic of a remote control reactor 300. The remote control reactor 300 comprises a first chamber 310, a filter 320, a shower head distributor (SHD) 330, and a second chamber 340. In some embodiments, an initial plasma 350 comprising radicals and charged ions is generated in the first chamber 310, then radicals of the resultant plasma pass through the filter 320 and thereafter enter into the second chamber 340 after passing through the SHD 330 to form a remote plasma 360 in the second chamber 340. In some embodiments, the charged ions in the initial plasma 350 do not pass through the filter 320, therefore the charged ions do not enter into the second chamber 340. In some embodiments, the substrate is positioned in the second chamber 340 and treated by the remote plasma 360.

Still referring to FIG. 7, the treatment 270 is performed over the dielectric layer 240 as well to form a treated dielectric region 240' in an upper portion of the dielectric layer 240. In some embodiments, the treated dielectric region 240' has a thickness ranging between about 10 Angstroms and about 50 Angstroms. In some embodiments, a thickness of the treated dielectric region 240' is about 1% to about 5% of the thickness of the dielectric layer 240. Comparing with the direct plasma treatment, the treatment 270 using remote plasma results in less damage to the surface of the dielectric layer 240 because of free or less charged ions in the remote plasma, thereby resulting in less carbon loss in the treated dielectric region 240'. In some embodiments, the treated dielectric region 240' comprises a C content substantially the same as the C content in the dielectric layer 240. In alternative embodiment, the treated dielectric region 240' comprises a C content less than the C content in the dielectric layer 240, while the difference of C contents in the treated dielectric region 240' and the dielectric layer 240 is less than 2 at %. In some embodiment, the treated dielectric region 240' comprises a C content not less than about 10 at %. In some embodiments, the treated dielectric region 240' has a dielectric constant ranging between about 2.5 and about 2.8. In some embodiments, the dielectric constant of the treated dielectric region 240' is substantially the same as the dielectric constant of the dielectric layer 240. In alternative embodiments, a difference between the dielectric constants of the treated dielectric region 240' and the dielectric layer 240 is less than about 2%.

Figure 9:
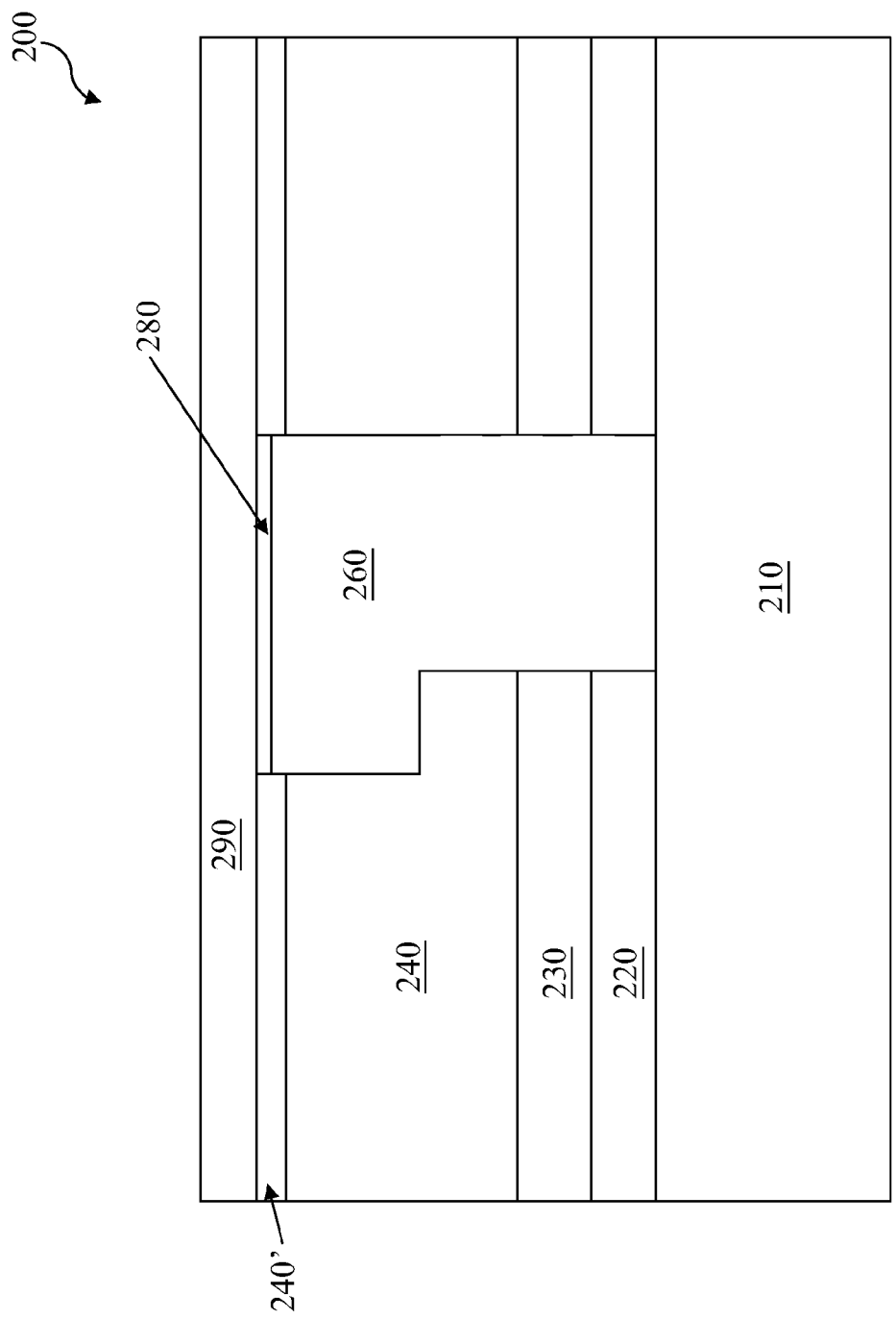

Referring to FIGS. 1 and 9, the method 100 continues with step 114 in which a second etch stop layer 290 is formed over the treated conductor 260. Alternatively, the second etch stop layer 290 is formed over the treated conductor 260 and the treated dielectric region 240'. The second etch stop layer 290 may control an end point during subsequent etching processes. The second etch stop layer 290 may be formed of silicon oxide, silicon nitride, silicon carbide, silicon oxynitride or combinations thereof. In some embodiments, the second etch stop layer 290 has a thickness of about 10 Angstroms to about 1000 Angstroms. In some embodiments, the second etch stop layer 290 may be formed through any of a variety of deposition techniques, including, LPCVD, APCVD, PECVD, PVD, and sputtering.

An adhesion value between the second etch stop layer 290 and the treated dielectric region 240' is improved by reduced carbon loss during the treatment 270, as mentioned above. In some embodiments, an adhesion value between the second etch stop layer 290 and the treated dielectric region 240' is about 13 J/m$^2$ or greater. The adhesion value is higher than that formed using methods in which no remote plasma is applied to the dielectric layer 240 by about 20% or greater.

Still referring to FIG. 9, a capping layer 280 may be formed between the conductor 260 and the second etch stop layer 290. In some embodiments, the capping layer 280 is formed before the deposition of the second etch stop layer 290 and functions as a diffusion barrier or adhesion promoter. In some embodiments, the capping layer 280 comprises cobalt or aluminum. In some embodiments, the capping layer 280 is selectively formed over the conductor 260 by ALD or PECVD.

In summary, the disclosed methods and integrated circuit devices result in improved device performance, including but not limited to, improved adhesion between the IMD layer, e.g., dielectric layer 240, and a subsequently formed etch stop layer, e.g., second etch stop layer 290, and thus peeling can be suppressed. Further, the method can improve package capabilities.

In one embodiment, a device comprises a substrate, a first etch stop layer over the substrate, a dielectric layer over the first etch stop layer, a conductor in the dielectric layer, and a second etch stop layer over the dielectric layer. The dielectric layer contains carbon and has a top portion and a bottom portion. A difference of C content within the top portion and the bottom portion is less than 2 at %. Oxygen content in a surface of the conductor is less than about 1 at %.

In another embodiment, a semiconductor device comprises a semiconductor substrate, a first etch stop layer over the semiconductor substrate, an adhesion layer over the first etch stop layer, a low-k dielectric layer comprising C, Si, O elements over the adhesion layer, a conductor in the dielectric layer, and a second etch stop layer over the conductor and the low-k dielectric layer. The low-k dielectric layer has an upper portion and a lower portion, an atomic percent of C in the upper portion is less than an atomic percent of C in the lower portion, and a difference of C content in the upper portion and the lower portion is less than about 2 at %. An oxygen content in a surface of the conductor is less than about 1 at %.

In still another embodiment, a method comprises forming a first etch stop layer over a substrate, forming a low-k dielectric layer comprising C over the first etch stop layer, forming an opening in the low-k dielectric layer, filling the opening with a conductive layer, performing a remote plasma treatment on the low-k dielectric layer and the conductive layer, and forming a second etch stop layer over the treated conductive layer and the treated low-k dielectric layer.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:
1. A device, comprising:
   a substrate;
   a first etch stop layer over the substrate;

a dielectric layer having a top portion and a bottom portion over the first etch stop layer, wherein the top portion and the bottom portion comprise different carbon (C) contents, and a difference of C content in the top portion and the bottom portion is less than 2 at %;

a conductor in the dielectric layer, wherein an oxygen content in a surface of the conductor is less than about 1 at %; and a second etch stop layer over the top portion of the dielectric layer, wherein a thickness of the top portion of the dielectric layer is about 1% to about 5% of a thickness of the dielectric layer.

2. The device of claim 1, wherein the C content in the top portion of the dielectric layer is less than the C content in the bottom portion of the dielectric layer.

3. The device of claim 1, wherein the C content in the top portion of the dielectric layer is not less than about 10 at %.

4. The device of claim 1, wherein the top portion of the dielectric layer has a thickness ranging between about 10 Angstroms and about 50 Angstroms.

5. The device of claim 1, further comprising a SiOx-containing layer, a SiCN-containing layer, or a SiON-containing layer positioned between the first etch stop layer and the dielectric layer.

6. The device of claim 1, further comprising a capping layer over the conductor, wherein a surface of the capping layer is substantially co-planar with a surface of the dielectric layer.

7. The device of claim 1, wherein an adhesion strength between the second etch stop layer and the dielectric layer is about 13 J/m$^2$ or greater.

8. The device of claim 1, wherein the surface of the conductor is substantially free of CuOx.

9. The device of claim 1, wherein a difference between a dielectric constant of the top portion of the dielectric layer and a dielectric constant of the bottom portion of the dielectric layer is less than about 2%.

10. The device of claim 1, wherein the conductor extends entirely through the dielectric layer.

11. A semiconductor device, comprising:
a semiconductor substrate;
a first etch stop layer over the semiconductor substrate;
an adhesion layer over the first etch stop layer;
a low-k dielectric layer comprising C, Si, O elements over the adhesion layer, wherein the low-k dielectric layer has an upper portion and a lower portion, an atomic percent of C in the upper portion is less than an atomic percent of C in the lower portion, and a difference of C content in the upper portion and the lower portion is less than about 2 at %;
a conductor in the dielectric layer, wherein an oxygen content in a surface of the conductor is less than about 1 at %; and
a second etch stop layer over the conductor and the low-k dielectric layer,
wherein a thickness of the upper portion of the low-k dielectric layer is about 1% to about 5% of a thickness of the low-k dielectric layer.

12. The semiconductor device of claim 11, wherein the atomic percent of C in the lower portion of the low-k dielectric layer ranges between about 10 at % and about 13 at %.

13. The semiconductor device of claim 11, wherein the atomic percent of C in the upper portion of the low-k dielectric layer is not less than about 10 at %.

14. The semiconductor device of claim 11, wherein a difference between a dielectric constant of the upper portion of the low-k dielectric layer and a dielectric constant of the lower portion of the low-k dielectric layer is less than about 2%.

15. The semiconductor device of claim 11, wherein an adhesion strength between the second etch stop layer and the low-k dielectric layer is about 13 J/m$^2$ or greater.

16. A semiconductor device comprising:
a substrate;
a dielectric layer on the substrate, wherein the dielectric layer has a first portion and a second portion, a dielectric constant of the first portion is different from a dielectric constant of the second portion, and a carbon concentration in the first portion is different from a carbon concentration of the second portion;
a conductive layer extending through the dielectric layer; and
a capping layer over the conductive layer, wherein a top surface of the capping layer is substantially coplanar with a top surface of the second portion of the dielectric layer,
wherein a thickness of the first portion of the dielectric layer is about 1% to about 5% of a thickness of the dielectric layer.

17. The semiconductor device of claim 16, wherein the capping layer comprises cobalt or aluminum.

18. The semiconductor device of claim 16, wherein a difference between the dielectric constant of the first portion and the dielectric constant of the second portion is less than 2%, and a difference between the carbon concentration in the first portion and the carbon concentration of the second portion is less than 2%.

19. The semiconductor device of claim 16, further comprising an etch stop layer over the conductive layer and the dielectric layer, wherein an adhesion strength between the etch stop layer and the dielectric layer is at least about 13 J/m$^2$.

20. The semiconductor device of claim 16, wherein the first portion of the dielectric layer has a thickness ranging between about 10 Angstroms and about 50 Angstroms.

* * * * *